US006323049B1

(12) United States Patent
Lee

(10) Patent No.: US 6,323,049 B1
(45) Date of Patent: Nov. 27, 2001

(54) METHOD FOR MANUFACTURING CONDENSER MICROPHONE

(75) Inventor: Joong-Kook Lee, Seoul (KR)

(73) Assignee: Won-Il Communics Co., Ltd., Seoul (KR)

( * ) Notice: Subject to any disclaimer, the term of this patent is extended or adjusted under 35 U.S.C. 154(b) by 0 days.

(21) Appl. No.: 09/679,136

(22) Filed: Oct. 3, 2000

(30) Foreign Application Priority Data

May 22, 2000 (KR) ........................................ 00-27512

(51) Int. Cl.[7] ........................................ H01L 21/66

(52) U.S. Cl. ........................ 438/15; 438/142; 438/106; 438/107

(58) Field of Search ........................ 438/14, 113, 142, 438/106, 107, 15; 179/111; 307/400

(56) References Cited

U.S. PATENT DOCUMENTS

| | | | | |
|---|---|---|---|---|
| 3,775,572 | * | 11/1973 | Ishibashi et al. | 179/111 R |
| 4,701,640 | * | 10/1987 | Flygstad et al. | 307/400 |
| 5,097,224 | * | 3/1992 | Madaffari et al. | 330/277 |
| 6,057,175 | * | 5/2000 | Milla et al. | 438/113 |

OTHER PUBLICATIONS

Van Sant, Peter; Microchip Fabrication, 1997, McGraw–Hill Third Edition p. 572.*

* cited by examiner

*Primary Examiner*—John F. Niebling
*Assistant Examiner*—Olivia Luk
(74) *Attorney, Agent, or Firm*—Sheridan Ross p.C.

(57) ABSTRACT

A method for manufacturing a condenser microphone capable of directly bonding an FET chip on each cell of a wafer on the pattern on a printed circuit board, thereby preventing the occurrence of badness by the disconnection of the FET terminals, removing the generation of noise, and achieving the microminiaturization of the product. The method for manufacturing a condenser microphone having a case, a diaphragm ring, a diaphragm, a spacer, a supporter, a back-pole plate, a connection ring, an FET chip and a printed circuit board, includes the steps of: dividing a wafer into cells each having a predetermined size and forming the FET chip on each cell; fixing the FET chip on a corresponding position of the printed circuit board on which a conductive material is patterned; bonding drain, source and gate terminals formed on the bottom surface of the FET chip with the corresponding connected portions on the printed circuit board by means of a metal wire; molding the FET chip and the surface of the printed circuit board and testing the operation state thereof; and assembling the diaphragm ring, the vibration, the spacer, the supporter, the back-pole plate, the connection ring and the printed circuit board on which the FET chip has been bonded in the named order into the case.

6 Claims, 2 Drawing Sheets

METHOD FOR MANUFACTURING CONDENSER MICROPHONE

BACKGROUND OF THE INVENTION

1. Field of the Invention

The present invention relates to a method for manufacturing a condenser microphone and more particularly, to a method for manufacturing a condenser microphone capable of directly bonding a field effect transistor (hereinafter, referred to as FET) chip which is formed on a wafer on a printed circuit board, thereby achieving miniaturization of the condenser microphone and improving the product characteristic.

2. Description of the Related Art

Generally, a condenser microphone is comprised of a condenser where a thin conductive film of diaphragm and a fixed electrode are arranged in parallel, for converting the vibration of sound into an electrical signal to obtain an electrical output.

The condenser microphone is used in a mike, a telephone or a tape record.

FIG. 1 is a separated perspective view illustrating the construction of a conventional condenser microphone, and FIG. 2 is a sectional view taken along a predetermined portion of FIG. 1.

As shown, the conventional condenser microphone includes: a case 8 through which a sound wave inflow hole 9 is formed; a filter 11 positioned on the top portion of the case 8, for preventing dust, moisture and foreign materials from flowing into the case 8 through the sound wave inflow hole 9; a diaphragm ring 7 positioned on the interior of the case 8, for maintaining a space in the interior of the case 8 to induce the vibration of sound flowing through the sound wave inflow hole 9; a diaphragm 6 positioned on the bottom end of the diaphragm ring 7 and vibrated by the sound flowing through the sound wave inflow hole 9; a spacer 5 positioned on the bottom end of the diaphragm 6, for maintaining the vibration state of the diaphragm 6 to transmit the vibration of sound; a supporter 3 positioned on the bottom end of the spacer 5, for supporting each part to prevent the movement thereof and the change of the whole shape of the condenser microphone; a back-pole plate 4 positioned on the interior of the supporter 3, for maintaining the vibration state, while being separated by a predetermined interval from the diaphragm 6 by means of the spacer 5 and for detecting capacitance which is varied in accordance with an amount of vibration of the diaphragm 6; a connection ring 10 positioned in the interior of the supporter 3 and on the bottom end of the back-pole plate 4, for connecting the gate of an FET 2 and the back-pole plate 4; a printed circuit board 1 on which a circuit of a conductive material is wired; and the FET 2 bonded on the printed circuit board 1, for amplifying and converting potential variation according to the variation of the capacitance into an electrical signal.

In this case, the FET 2 is packaged and produced by a semiconductor company. The packaging process of the FET 2 is carried out as follows: Firstly, a wafer is scribed in a predetermined size and the FET chip is formed on each of the scribed cells. Then, after cutting each FET chip formed on the wafer, a predetermined length of needle is bonded on the gate, the source and the drain, respectively, formed on the bottom surface of the FET chip. Next, a molding process is carried out for each bonded FET by means of an epoxy resin, thereby producing the FET 2.

In the conventional practice, the condenser microphone is manufactured by using the FET 2 produced by the above-mentioned process.

Referring to FIG. 1 showing the separated perspective view of the condenser microphone manufactured in the conventional practice, the diaphragm ring 7, the vibration 6, the spacer 5, the back-pole plate 4 and the supporter 3 are assembled in the named order into the case 9. Finally, the printed circuit board 1 on which the FET 2 is soldered is fixedly coupled on the bottom end of the supporter 3 and the case 9, thereby manufacturing one condenser microphone.

In this case, the coupling process of the FET 2 with the printed circuit board 1 in the soldering manner is carried out as follows:

Firstly, each of the drain, source and gate terminals of the FET 2 is connected to the corresponding hole provided on the printed circuit board 1, and the gate terminal of the FET 2 is connected to the back-pole plate 4. The connection of the gate terminal of the FET 2 and the back-pole plate 4 is achieved by a point contact method or by using the connection ring 10. Recently, the connection ring connecting method is widely used.

To connect the FET 2 and the printed circuit board 1, the end of each of the drain, source and gain terminals is bent at a predetermined angle toward the printed circuit board 1.

The bent end of each of the drain, source and gain terminals is inserted into a through hole provided on the printed circuit board 1. The drain, source and gain terminals, which are passed through the printed circuit board 1 via the through hole, are protruded on the rear surface of the printed circuit board 1. And, the end of the protruded drain, source and gain terminals is re-bent at a predetermined angle to surround the printed circuit board 1, with a consequence that the FET 2 and the printed circuit board 1 are temporarily fixed. After the manufacturing process, each terminal, which has been bent to fix the FET 2 and the printed circuit board 1, should be bent to its original state.

In this case, the connection of the FET 2 and the printed circuit board 1 is achieved in a soldering manner or by using an SMD (Surface Mount Device).

After the completion of the connection of the FET 2 and the printed circuit board 1, the printed circuit board 1 is assembled in the interior of the case 9, thereby manufacturing the condenser microphone.

The size of the condenser microphone is determined upon the size of the FET 2, and if the condenser microphone is manufactured by using the FET 2 as mentioned above, the thickness 'L' of the condenser microphone is ranged up to 1.5 (mm).

However, the conventional condenser microphone arises the following some problems that since the drain, source and gate terminals are repeatedly bent, the bent portions may be disconnected; that since the terminals of the FET 2 and the printed circuit board 1 are bonded in the soldering manner, a undesirable noise may be generated due to contact resistance; and that if heat is applied on the rear surface of the printed circuit board 1 for wiring, the terminals connected to the FET 2 may be disconnected.

On the other hand, the conventional method for manufacturing the condenser microphone is dependent upon the production method and amount determined by the semiconductor manufacturing company producing the FET as a main member of the condenser microphone, which will place restrictions on an amount of the production of the condenser microphone.

SUMMARY OF THE INVENTION

It is, therefore, an object of the present invention to provide a method for manufacturing a condenser microphone capable of directly bonding an FET chip formed on each cell of a wafer on a pattern of a printed circuit board, thereby preventing the generation of badness caused due to the disconnection of the FET terminals, achieving the removal of noise and producing microminiaturization product.

To attain this and other objects of the present invention, there is provided a method for manufacturing a condenser microphone having a case, a diaphragm ring, a diaphragm, a spacer, a supporter, a back-pole plate, a connection ring, an FET chip and a printed circuit board, which comprises the steps of: dividing a wafer into cells each having a predetermined size and forming the FET chip on each cell; fixing the FET chip on a corresponding position of the printed circuit board on which a conductive material is patterned; bonding drain, source and gate terminals formed on the bottom surface of the FET chip with the corresponding connected portions on the printed circuit board by means of a metal wire; molding the FET chip and the surface of the printed circuit board and testing the operation state thereof; and assembling the diaphragm ring, the vibration, the spacer, the supporter, the back-pole plate, the connection ring and the printed circuit board on which the FET chip has been bonded in the named order into the case.

DETAILED DESCRIPTION OF THE PREFERRED EMBODIMENT

Now, an explanation of a method for manufacturing a condenser microphone according to the present invention will be hereinafter discussed with reference to FIG. 3.

Figure 1:
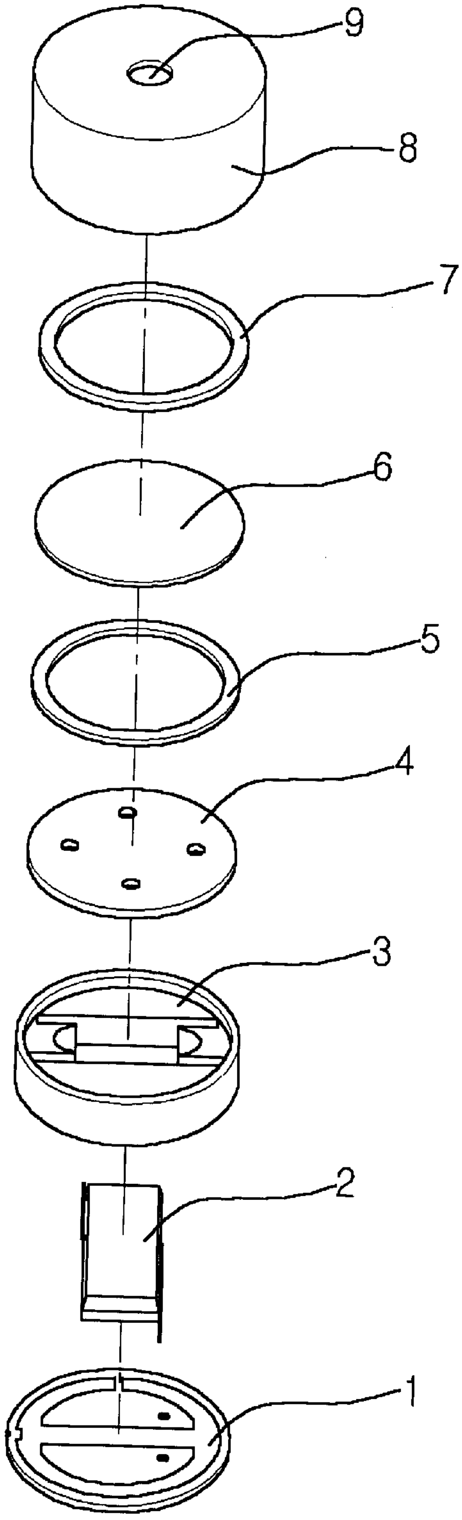
FIG. 1 is a separated perspective view illustrating the construction of a conventional condenser microphone.
Figure 2:
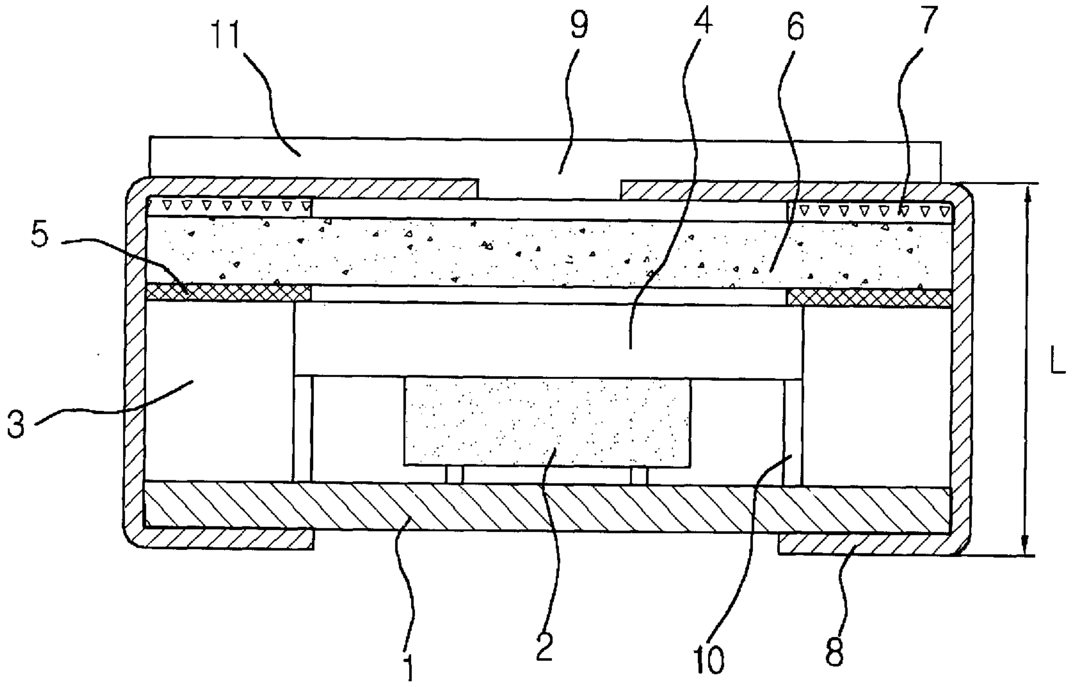
FIG. 2 is a sectional view taken along a predetermined portion of FIG. 1.
Figure 3:
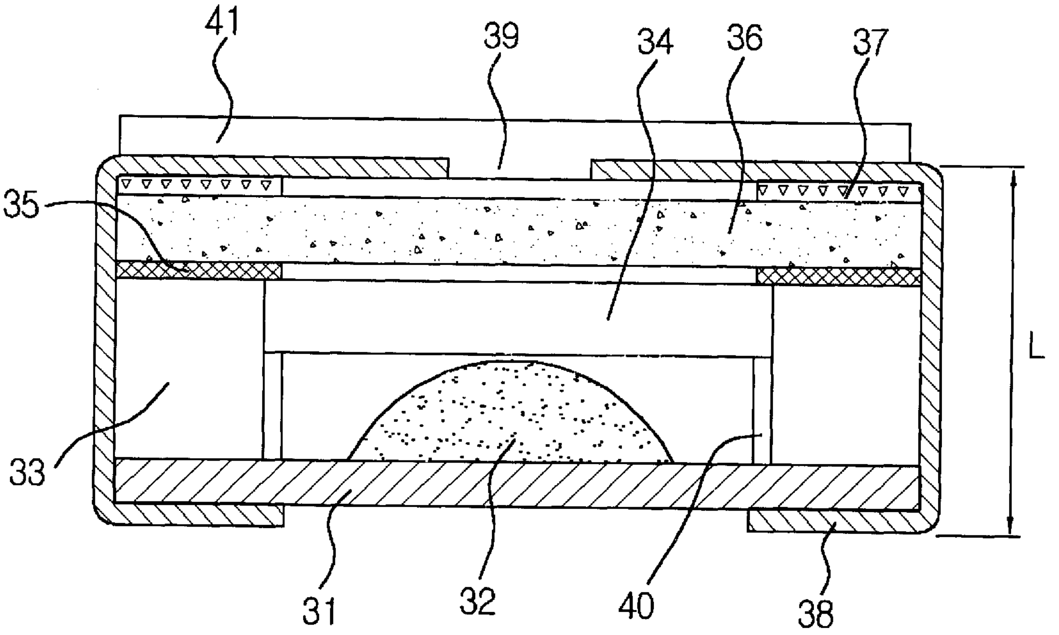
FIG. 3 is a sectional view taken along a predetermined portion of a condenser microphone manufactured according to the present invention.

FIG. 3 is a sectional view taken along a predetermined portion of a condenser microphone manufactured according to the present invention.

As shown, a method for manufacturing a condenser microphone according to the present invention includes: a case 38 serving to protect each part and maintain the outer shape of the condenser microphone and having a sound wave inflow hole 39 formed through the top portion thereof; a filter 41 positioned on the exterior of the case 38, for preventing dust, moisture and foreign materials from flowing into the case 38 through the sound wave inflow hole 39; a diaphragm ring 37 positioned on the interior of the case 38, for maintaining a space in the interior of the case 38 to induce the vibration of sound flowing through the sound wave inflow hole 39; a diaphragm 36 positioned on the bottom end of the diaphragm ring 37 and vibrated by the sound flowing through the sound wave inflow hole 39; a spacer 35 positioned on the bottom end of the diaphragm 36, for maintaining the vibration state of the diaphragm 36 to transmit the vibration of sound; a supporter 33 positioned on the bottom end of the spacer 35, for supporting each part to prevent the movement thereof and the change of the whole shape of the condenser microphone; a back-pole plate 34 positioned on the interior of the supporter 33, for maintaining the vibration state, while being separated by a predetermined interval from the diaphragm 36 by means of the spacer 35 and for detecting capacitance which is varied in accordance with an amount of vibration of the diaphragm 36; a connection ring 40 positioned in the interior of the supporter 33 and on the bottom end of the back-pole plate 34, for connecting the gate of an FET 32 and the back-pole plate 34; a printed circuit board 31 on which a circuit of a conductive material is wired; and the FET 32 bonded on the printed circuit board 31, for amplifying and converting potential variation according to the variation of the capacitance into an electrical signal.

In this case, an explanation of a method for manufacturing the condenser microphone constructed as mentioned above according to the present invention will be discussed hereinafter.

Firstly, a disc wafer (which is not shown in the drawing) made of silicon single crystal, which is used as a material of a semiconductor integrated circuit (IC), is divided into a plurality of cells. The division of the wafer is carried out by using a scribing method where the wafer surface is scribed vertically and horizontally at predetermined intervals by means of a diamond cutter or by using a sawing method where the wafer surface is sawn vertically and horizontally at predetermined intervals by rotating a wheel on which a sharp knife is mounted. Recently, the sawing method is widely used, since it can provide a relatively smoothly divided surface, thereby ensuring more delicate division. At this time, each cell of the wafer has a size of 0.4 mm×0.4 mm.

Next, the FET chip 32 is formed on each cell of the wafer.

On the other hand, the rear surface of the printed circuit board 31 where the circuit of a conductive material is wired re-flows by using a solder paste. The solder paste is applied on the portion where soldering is required by the re-flow of the printed circuit board.

The FET chip 32 formed on the wafer is fixed on a corresponding position of other side of the printed circuit board 31 re-flowing by the application of the solder paste. The fixing method is carried out by fixedly bonding the gate, drain and source exposed on the bottom surface of the FET chip 32 on the corresponding positions of the printed circuit board 31 by means of an adhesive material. The adhesive material is made of a semiconductive material obtained by mixing silver (Ag) and an epoxy resin in an appropriate ratio.

In the state where the FET chip 32 is fixed on the printed circuit board 31, the drain, source and gate of the FET chip 32 and their corresponding positions of the printed circuit board 31 are bonded to each other by using an aluminum wire or a gold wire. The bonded portions to the drain and source of the FET chip 32 are connected to the pattern on the bottom surface of the printed circuit board, thereby being connected to external terminals on which the sound signal is outputted.

The part of the printed circuit board 31 bonded to the gate terminal of the FET chip 32 comes in contact with the connection ring 40 and becomes conductive, and the connection ring 40 is connected to the back-pole plate 34 and becomes conductive.

The bonding of the FET chip 32 and the printed circuit board 31 is carried out by means of the aluminum wire or the gold wire, the thickness of the bonding is about 30 $\mu$m, the epoxy resin used is 'CR-2000' or 'CRH-210', and the bonded state is dried for 1.5 hour at a temperature of 150° C.

After the drain, source and gate of the FET chip 32 are bonded on the printed circuit board 31, the printed circuit board 31 and the FET chip 32 are molded by means of the epoxy resin, thereby protecting the product from foreign materials and preventing the erosion of the product.

After the completion of the connection of the printed circuit board 31 with the FET chip 32, a testing step of checking the conductive state, that is, the coupled printed circuit board 31 and the FET chip 32 operate normally, is carried out.

Next, the diaphragm ring 37, the diaphragm 36, the spacer 35, the supporter 33, the back-pole plate 34, the connection ring 40 and the printed circuit board 31 on which the FET chip 32 has been bonded are assembled in the named order within the case 38, thereby producing the condenser microphone. In this case, the height of the FET chip 32 is 0.2 mm and the height of the whole condenser microphone is ranged up to 0.8~1.0 (mm).

As discussed above, a method for manufacturing a condenser microphone according to the present invention is capable of providing the following advantages: Firstly, since an FET chip in a wafer state is directly bonded on the pattern on a printed circuit board, the size of the product can be substantially reduced, thereby achieving microminiaturization of the product; the generation of noise caused due to the soldering on the terminals of the FET chip can be prevented; and the occurrence of badness by the disconnection of the terminals bonded on the FET chip due to the heat generated upon soldering can be eliminated.

What is claimed is:

1. A method for manufacturing a condenser microphone having a case, a diaphragm ring, a diaphragm, a spacer, a supporter, a back-pole plate, a connection ring, an FET (Field Effect Transistor) chip and a printed circuit board, said method comprising, the steps of:

cutting out an FET chip formed on a wafer therefrom;

fixing the gate Surface on said FET chip to the corresponding mounting region of said gate on a printed circuit board patterned with electric conductors using a conductive material, and curing thereof;

bonding the portions of the drain and the source on said FET chip to each corresponding region of said drain and source on said circuit board using metal wires;

molding said FET chip fixed on said printed circuit board, and curing thereof; and assembling said diaphragm ring, diaphragm, spacer, supporter, backpole plate, connection ring, and printed circuit board fixed with said FET chip into a case in that order.

2. The method of claim 1, wherein said printed circuit board on which said FET chip has been bonded forms a circuit of a conductive material patterned on the upper and lower surfaces thereof, respectively, and re-flows by solder paste on the rear surfaces thereof.

3. The method of claim 1, wherein said adhesive material comprises a silver epoxy resin obtained by mixing silver (Ag) with an epoxy resin in a predetermined ratio.

4. The method of claim 1, wherein said FET chip fixed on said printed circuit board is molded with an epoxy resin.

5. The method of claim 1, wherein said epoxy resin is "CR-2000" or "CRH-210".

6. The method of claim 1, wherein said molded chip fixed on said printed circuit board is dried for 1.5 hours at the temperature of 150° C.

* * * * *